US009036351B2

(12) United States Patent
Facusse

(10) Patent No.: US 9,036,351 B2
(45) Date of Patent: May 19, 2015

(54) PASSIVE COOLING SYSTEM AND METHOD FOR ELECTRONICS DEVICES

(75) Inventor: Mario Facusse, Miami, FL (US)

(73) Assignee: Xyber Technologies, LLC, Miami, FL (US)

( * ) Notice: Subject to any disclaimer, the term of this patent is extended or adjusted under 35 U.S.C. 154(b) by 0 days.

(21) Appl. No.: 12/488,818

(22) Filed: Jun. 22, 2009

(65) Prior Publication Data

US 2010/0259899 A1 Oct. 14, 2010

(51) Int. Cl.
*H05K 7/20* (2006.01)

(52) U.S. Cl.
CPC .................................. *H05K 7/20809* (2013.01)

(58) Field of Classification Search
CPC ........................ H05K 7/20218–7/20281; H01L 23/473–23/4735
USPC ............... 361/679.46–679.54, 688–723, 788; 165/80.1–80.5, 104.33, 185; 174/15.1–15.2, 16.1–16.3, 521, 526, 174/547–548; 257/712–722, E23.088; 454/184
See application file for complete search history.

(56) References Cited

U.S. PATENT DOCUMENTS

| | | | |
|---|---|---|---|
| 3,904,933 A | 9/1975 | Davis | |
| 4,111,328 A | 9/1978 | Eggert et al. | |
| 4,449,576 A | 5/1984 | Baum et al. | |
| 4,771,365 A | 9/1988 | Cichocki et al. | |
| 4,777,561 A | 10/1988 | Murphy et al. | |
| 5,177,666 A | 1/1993 | Bland et al. | |
| 5,339,214 A * | 8/1994 | Nelson | 361/695 |
| 5,343,358 A * | 8/1994 | Hilbrink | 361/700 |
| 5,549,155 A * | 8/1996 | Meyer et al. | 165/104.33 |
| 5,801,924 A | 9/1998 | Salmonson | |
| 5,822,187 A * | 10/1998 | Garner et al. | 361/679.27 |
| 5,826,645 A * | 10/1998 | Meyer et al. | 165/104.33 |
| 5,926,369 A * | 7/1999 | Ingraham et al. | 361/699 |
| 5,946,191 A * | 8/1999 | Oyamada | 361/700 |
| 6,021,044 A * | 2/2000 | Neville et al. | 361/700 |
| 6,141,216 A * | 10/2000 | Holung et al. | 361/679.52 |
| 6,186,889 B1 * | 2/2001 | Byrne | 454/184 |
| 6,189,213 B1 * | 2/2001 | Kimura et al. | 29/890.035 |
| 6,313,990 B1 | 11/2001 | Cheon | |
| 6,360,813 B1 | 3/2002 | Katoh et al. | |
| 6,373,696 B1 | 4/2002 | Bolognia et al. | |
| 6,542,364 B2 * | 4/2003 | Lai et al. | 361/697 |
| 6,549,414 B1 * | 4/2003 | Tokuhara et al. | 361/719 |
| 6,674,643 B2 * | 1/2004 | Centola et al. | 361/720 |

(Continued)

FOREIGN PATENT DOCUMENTS

| | | |
|---|---|---|
| CN | 1440075 A | 9/2003 |
| JP | 56-094698 A | 7/1981 |

(Continued)

OTHER PUBLICATIONS

Non-final Office Action received for U.S. Appl. No. 12/716,888 dated Feb. 29, 2012.

(Continued)

*Primary Examiner* — Michail V Datskovskiy
*Assistant Examiner* — Razmeen Gafur
(74) *Attorney, Agent, or Firm* — Foley & Lardner, LLP

(57) ABSTRACT

An apparatus for passively cooling electronics. The apparatus for passively cooling electronics includes at least one heat pipe and at least one heat sink thermally coupled to a bridge plate. When a cradle is thermally coupled to the at least one heat pipe, the at least one heat sink draws heat from the cradle.

20 Claims, 8 Drawing Sheets

(56) References Cited

U.S. PATENT DOCUMENTS

| | | | |
|---|---|---|---|
| 6,708,754 B2 * | 3/2004 | Wei | 165/46 |
| 6,796,372 B2 | 9/2004 | Bear | |
| 6,833,991 B2 | 12/2004 | Van Gaal | |
| 6,839,232 B2 | 1/2005 | Elo et al. | |
| 7,012,807 B2 | 3/2006 | Chu et al. | |
| 7,012,815 B2 | 3/2006 | Garnett et al. | |
| 7,085,136 B2 | 8/2006 | Lin | |
| 7,096,928 B2 | 8/2006 | Phillips et al. | |
| 7,133,283 B2 | 11/2006 | Faneuf et al. | |
| 7,133,284 B2 | 11/2006 | Lee | |
| 7,136,286 B2 | 11/2006 | Chuang | |
| 7,209,348 B2 | 4/2007 | Yazawa | |
| 7,209,353 B2 | 4/2007 | Ammirata | |
| 7,233,491 B2 | 6/2007 | Faneuf et al. | |
| 7,319,588 B2 | 1/2008 | Peng et al. | |
| 7,345,877 B2 | 3/2008 | Asfia et al. | |
| 7,403,384 B2 | 7/2008 | Pflueger | |
| 7,447,017 B2 | 11/2008 | Koo | |
| 7,457,118 B1 * | 11/2008 | French et al. | 361/700 |
| 7,480,140 B2 * | 1/2009 | Hara et al. | 361/692 |
| 7,508,669 B2 | 3/2009 | Fonfara et al. | |
| 7,626,820 B1 | 12/2009 | Konshak et al. | |
| 7,907,409 B2 | 3/2011 | Wyatt et al. | |
| 2002/0008961 A1 * | 1/2002 | Amaike et al. | 361/687 |
| 2003/0000721 A1 | 1/2003 | Garner | |
| 2003/0010477 A1 | 1/2003 | Khrustalev et al. | |
| 2003/0024687 A1 * | 2/2003 | Cheng et al. | 165/80.3 |
| 2004/0012924 A1 | 1/2004 | Hanson et al. | |
| 2004/0182552 A1 * | 9/2004 | Kubo | 165/104.33 |
| 2004/0188080 A1 * | 9/2004 | Gailus et al. | 165/185 |
| 2004/0190249 A1 * | 9/2004 | Hasegawa et al. | 361/697 |
| 2004/0257770 A1 * | 12/2004 | Hu | 361/704 |
| 2005/0030719 A1 * | 2/2005 | Lin et al. | 361/719 |
| 2005/0083660 A1 * | 4/2005 | Lee | 361/709 |
| 2005/0088822 A1 | 4/2005 | Oberlin et al. | |
| 2005/0099776 A1 | 5/2005 | Xue et al. | |
| 2005/0114876 A1 | 5/2005 | Atarashi et al. | |
| 2005/0135063 A1 * | 6/2005 | Heesen | 361/700 |
| 2005/0141202 A1 * | 6/2005 | Lee et al. | 361/704 |
| 2005/0207121 A1 * | 9/2005 | Egawa | 361/703 |
| 2005/0270751 A1 | 12/2005 | Coglitore et al. | |
| 2005/0286229 A1 * | 12/2005 | Ku | 361/709 |
| 2005/0286230 A1 | 12/2005 | Yatskov | |
| 2006/0005980 A1 | 1/2006 | Garner | |
| 2006/0007660 A1 | 1/2006 | Yatskov et al. | |
| 2006/0044760 A1 | 3/2006 | Pal | |
| 2006/0109631 A1 | 5/2006 | Marro et al. | |
| 2006/0139880 A1 * | 6/2006 | Tate | 361/697 |
| 2006/0146496 A1 | 7/2006 | Asfia et al. | |
| 2006/0279926 A1 * | 12/2006 | Koo | 361/688 |
| 2007/0047206 A1 * | 3/2007 | Lee et al. | 361/703 |
| 2007/0070600 A1 * | 3/2007 | Tomioka et al. | 361/688 |
| 2007/0163770 A1 * | 7/2007 | Liu et al. | 165/185 |
| 2007/0171616 A1 | 7/2007 | Peng et al. | |
| 2007/0236885 A1 * | 10/2007 | Zhao et al. | 361/700 |
| 2007/0236888 A1 * | 10/2007 | Eckberg et al. | 361/704 |
| 2007/0242438 A1 * | 10/2007 | Belits et al. | 361/700 |
| 2008/0007913 A1 | 1/2008 | Sullivan et al. | |
| 2008/0007915 A1 * | 1/2008 | Chen | 361/701 |
| 2008/0013270 A1 | 1/2008 | Sullivan | |
| 2008/0024992 A1 | 1/2008 | Pflueger | |
| 2008/0035311 A1 * | 2/2008 | Hsu | 165/104.21 |
| 2008/0042429 A1 * | 2/2008 | Schick et al. | 285/21.2 |
| 2008/0043442 A1 | 2/2008 | Strickland et al. | |
| 2008/0055851 A1 | 3/2008 | Hall et al. | |
| 2008/0087406 A1 | 4/2008 | Asfia et al. | |
| 2008/0117593 A1 * | 5/2008 | Andric et al. | 361/697 |
| 2008/0174955 A1 * | 7/2008 | Eddy et al. | 361/688 |
| 2008/0180915 A1 * | 7/2008 | Lin | 361/704 |
| 2008/0212289 A1 * | 9/2008 | Lin | 361/719 |
| 2008/0218961 A1 * | 9/2008 | Wu et al. | 361/687 |
| 2008/0218980 A1 | 9/2008 | Tracewell et al. | |
| 2008/0259566 A1 | 10/2008 | Fried | |
| 2009/0004902 A1 * | 1/2009 | Pandey et al. | 439/331 |
| 2009/0009958 A1 | 1/2009 | Pflueger | |
| 2009/0009969 A1 | 1/2009 | Chu | |
| 2009/0025909 A1 * | 1/2009 | Huang | 165/104.26 |
| 2009/0040725 A1 | 2/2009 | Peng et al. | |
| 2009/0151492 A1 * | 6/2009 | Chiang et al. | 74/423 |
| 2009/0168345 A1 | 7/2009 | Martini | |
| 2009/0190303 A1 * | 7/2009 | Chu et al. | 361/679.47 |
| 2009/0211730 A1 | 8/2009 | Zhou et al. | |
| 2009/0225515 A1 | 9/2009 | Hom et al. | |
| 2010/0032141 A1 | 2/2010 | Heydari et al. | |
| 2010/0175851 A1 | 7/2010 | Heydari et al. | |
| 2010/0290186 A1 | 11/2010 | Zeng et al. | |

FOREIGN PATENT DOCUMENTS

| | | |
|---|---|---|
| JP | 2002-032153 | 1/2002 |
| JP | 2002-324993 | 11/2002 |
| JP | 2003-035441 | 2/2003 |
| JP | 2004-246649 | 9/2004 |
| JP | 2005-158101 | 6/2005 |
| JP | 2006-073099 | 3/2006 |

OTHER PUBLICATIONS

First Office Action received in China Patent Application No. 201080037116.2 issued Mar. 5, 2014 (17 pages) with English translation.

Office Action received in Japanese Patent Application No. 2012-517515 issued Apr. 1, 2014 (7 pages) with English Translation.

Final Office Action issued for U.S. Appl. No. 12/716,888 mailed May 21, 2013 (28 pages).

Final Office Action on U.S. Appl. No. 12/716,888, mailed Jun. 21, 2012.

Notice of Allowance issued in U.S. Appl. No. 12/716,888 mailed Aug. 1, 2013 (12 pages).

International Search Report and Written Opinion received for PCT/US2010/030118 dated Oct. 20, 2010.

Non-final Office Action received for U.S. Appl. No. 12/716,888 dated Jan. 21, 2011.

Non-Final Office Action received in U.S. Appl. No. 12/716,888 dated Jan. 3, 2013 (22 pages).

Final Office Action; In re: U.S. Appl. No. 12/716,888; Dated: Oct. 14, 2011; Applicant: Mario Facusse; (12 pgs.).

Decision of Rejection received in Japanese Patent Application No. 2012-517515 issued Jan. 6, 2015 (received Feb. 19, 2015), 4 pages—with English Translation.

* cited by examiner

PASSIVE COOLING SYSTEM AND METHOD FOR ELECTRONICS DEVICES

BACKGROUND

The present disclosure relates generally to the field of passive cooling and more particularly to passive cooling of electronics devices.

Legacy electronics device cooling technologies typically use a forced air cooling method to remove heat from the electronics device. More recently, advanced cooling methods, such as water cooling and phase cooling systems, have been explored. However, there are many issues, for example with installation and maintenance, that arise from the use of these systems in electronics devices.

The majority of existing systems depend on a forced air cooling method, i.e. fans. In existing systems, fans are used to directly cool processors and other internal components. Fans suffer from multiple deficiencies. For example, fans require significant physical space, are noisy because of high RPMs, require a significant ventilation space, produce heat as they are working to reduce heat, and consume vast amounts of power to operate. Additionally, the manufacturing process by which the majority of fans are made in some instances may use harmful industrial chemicals that could be reactivated as the temperature of a fan's blades increases thereby releasing these chemicals into exposed environments. Thus, there are high costs as well as potential health and environmental issues associated with operating fan-based systems. Often, data centers are designed for more wattage then necessary in order to account for necessary, but inefficient cooling systems. In addition, fan-based systems are prone to failure due to accumulation of dust, motor malfunction or burn-out thereby increasing operational and maintenance costs. When over-heating occurs components suffer irreversible damage, increasing cost, power consumption, and environmental impact.

Liquid cooling systems are two systems in one. Liquid cooling systems are greatly limited in their cooling capacity, depending on the configuration of the electronics device. Liquid cooling systems require heat exchangers such as a radiator. As a result, liquid cooling systems still require fans to cool the radiator and other components not attached to a heat exchanger thereby supplanting the inefficiency of a forced air cooling system with a potentially dangerous and costly liquid cooling system still reliant on fans. Liquid cooling systems require significant physical space, are complicated, are noisy because of radiator fans, require a significant ventilation space, produce heat as they are working to reduce heat, and consume vast amounts of power to operate and maintain. The end user must devote significant time and effort to set-up and maintain a liquid cooling system.

Moreover, the proximity of cooling liquid with electronics is a potential safety risk. Because components produce a lot of heat, the tubing typically used is constantly expanding and contracting causing the tubes to fail and leak cooling solution, which can result in electrical shorts and irreparable internal damage.

Phase cooling involves using a compressor system to cool electronics. Phase cooling typically only cools the CPU so fans are still needed to cool other components. The fans and compressor make a significant amount of noise, require extensive maintenance, and consume a significant amount of power. Operating a phase cooling system requires a high degree of technical proficiency.

Thus, improved cooling systems and techniques are needed.

SUMMARY

A representative embodiment relates to an apparatus for passively cooling electronics. The apparatus for passively cooling electronics includes at least one heat pipe and at least one heat sink thermally coupled to a bridge plate. When a cradle is thermally coupled to the at least one heat pipe, the at least one heat sink draws heat from the cradle.

Another representative embodiment relates to a method for passively cooling electronics. The method includes drawing heat from an electronic component through a cradle to at least one heat pipe. The heat from the at least one heat pipe is drawn to at least one heat sink through a bridge plate and is dissipated.

Another representative embodiment relates to an apparatus for passively cooling electronics. The apparatus for passively cooling electronics includes a cradle configured to thermally couple at least one heat pipe and an electronic component. The apparatus for passively cooling electronics also includes a clamping mechanism configured to enhance the thermal coupling of the cradle to the at least one heat pipe.

DETAILED DESCRIPTION

A passive cooling system and method for electronics devices are described. In the following description, for purposes of explanation, numerous specific details are set forth to provide a thorough understanding of representative embodiments of the invention. It will be evident, however, to one skilled in the art that the representative embodiments may be practiced without these specific details. The drawings are not to scale. In other instances, well-known structures and devices are shown in simplified form to facilitate description of the representative embodiments.

Figure 1:
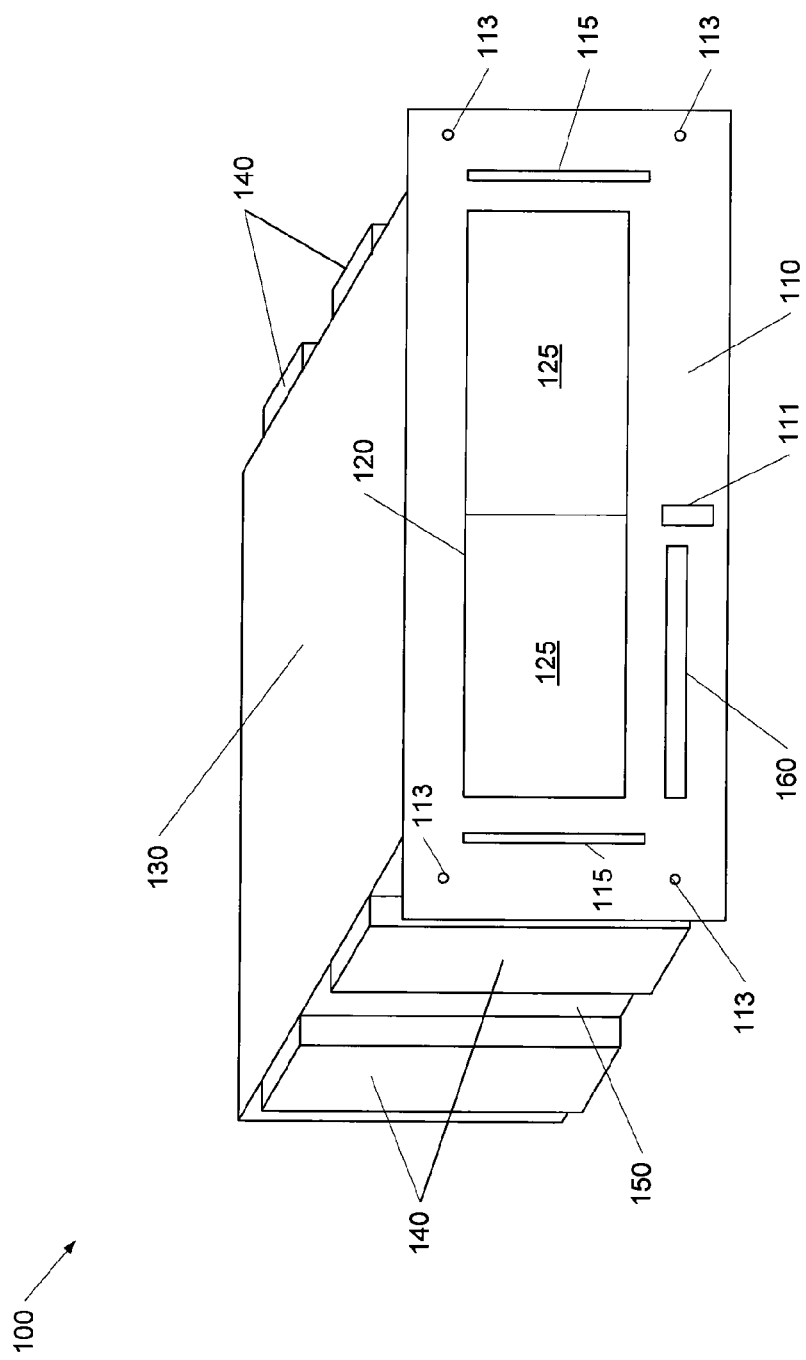
FIG. 1 is a perspective view of a passive cooling system in accordance with a representative embodiment.

Referring to FIG. 1, a perspective view of a passive cooling system 100 in accordance with a representative embodiment is shown. In an embodiment, the passive cooling system 100 is configured as a rack-mount chassis. The passive cooling system 100 includes a front panel 110, a drive bay 120, a cover 130, heat sinks 140, filler strip 150, and a media drive 160. The front panel 110 includes holes 113 for mounting the passive cooling system 100 to a rack (not shown). The rack can be a 19 inch rack, a 23 inch rack, a half rack, or any other size or depth rack. Likewise, non-rack configurations are possible. Additionally, the holes 113 can include quick connects, rails, or other fasteners. The front panel 110 also includes handles 115 for moving the passive cooling system 100 and a latch 111 for securing bay doors 125 that cover the drive bay 120. The media drive 160 can be, for example, a compact disc (CD) burner or a tape drive.

The passive cooling system 100 can be any height or depth. In particular, the drive bay 120 can be a 1 unit, 2 unit, 4 unit, 8 unit, or 16 unit bay. The bays can be configured in various configurations such as horizontal or vertical. Additionally, the passive cooling system 100 can include other input devices such as removable media drives, keyboards, displays, mice, or joysticks. Alternatively, the passive cooling system 100 can be a programmable logic controller chassis, a blade chassis, a VMEbus-type enclosure, a PCI-type enclosure, a Compact-PCI-type enclosure, a server, or any other electronic device with modular bays and/or sub-bays. The passive cooling system 100 can also be a desktop computer, a tower computer, an all-in-one system where the display is integrated, an appliance, or a mobile platform such as a laptop.

Figure 2:
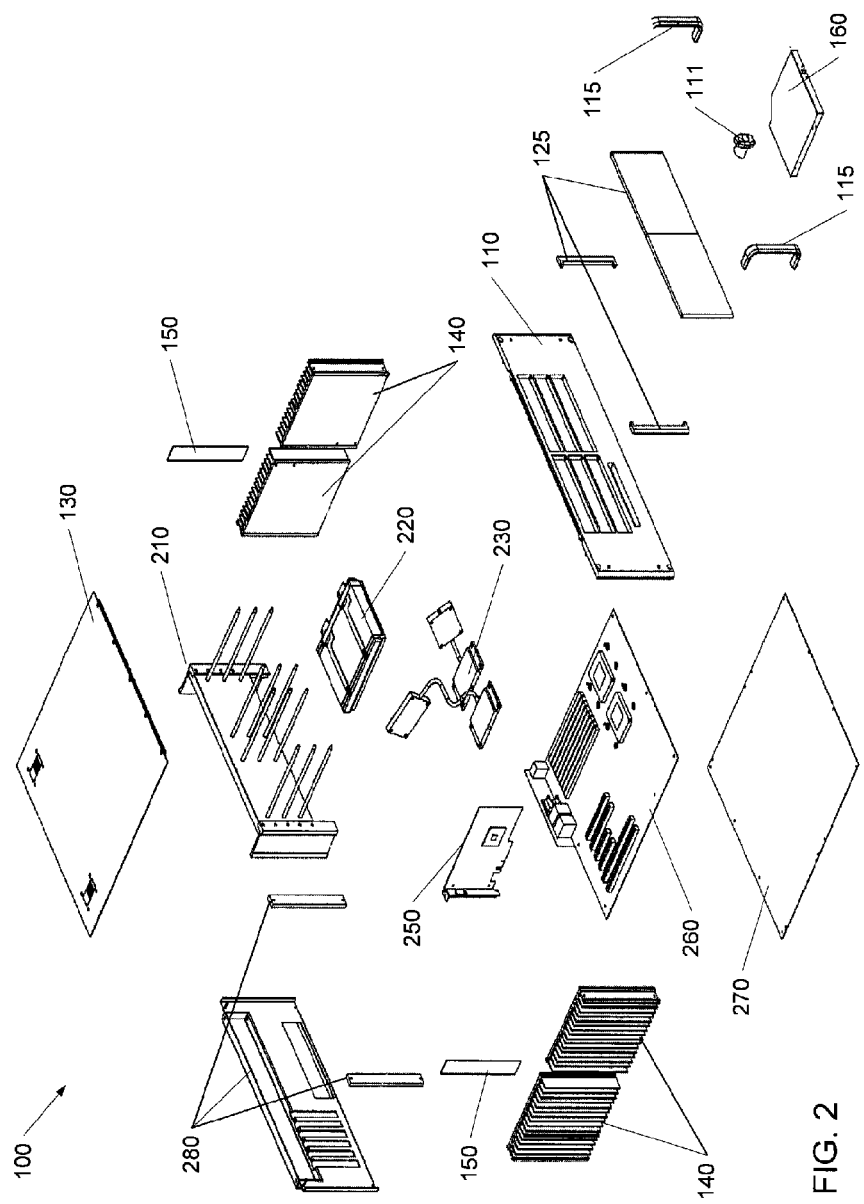
FIG. 2 is an exploded view of the passive cooling system of FIG. 1 in accordance with a representative embodiment.

Referring to FIG. 2, an exploded view of the passive cooling system 100 of FIG. 1 in accordance with a representative embodiment is shown. The passive cooling system 100 includes a front panel 110, a cover 130, heat sinks 140, filler strip 150, and a media drive 160. The front panel 110 includes handles 115 and a latch 111 for securing bay doors 125 that cover the drive bay. The passive cooling system 100 also includes a heat pipe assembly 210, a device module 220, a processor heat pipe assembly 230, a motherboard 260, a daughterboard 250, a bottom 270, and a back panel 280. The front panel 110, the cover 130, heat sinks 140, filler strip 150, the bottom 270, and the back panel 280 constitute the enclosure of the passive cooling system 100.

The device module 220 includes a cradle assembly and an electronic component. Preferably, the electronic component is a hot-swappable non-volatile storage device such as a hard drive. Alternatively, the electronic component can be any electronic device; for example, a 3.5" hard drive, a 2.5" hard drive, a 5.25" drive, an optical drive, a tape drive, solid state drive, a card reader, a memory bank, a magnetic memory bank, a communications module, a daughterboard, a sensor module, or an input/output module. The electronic component is thermally coupled to the cradle assembly. The cradle assembly draws heat away from the electronic component. The passive cooling system 100 can include a plurality of device modules. The cradle assembly can also include a clamping or securing mechanism as described in more detail below.

The device module 220 is removably mounted on the heat pipe assembly 210 via the cradle assembly. The device module 220 is thermally coupled to the heat pipe assembly 210. The heat pipe assembly 210 is thermally coupled to the heat sinks 140 and filler strip 150. The heat pipe assembly 210 draws heat from the device module 220. The heat sinks 140 draw heat from the heat pipe assembly 210. Each of the thermal couplings where two separate pieces meet can include a thermal compound to enhance the thermal characteristics of the junction. Alternatively, the heat pipe assembly 210, heat sinks 140 and filler strip 150 can be one piece that is thermally continuous. The heat pipe assembly 210 can also include electrical connections for the electronic component. The heat pipe assembly 210 is described in more detail below.

The electronic component of device module 220 is electrically connected to the motherboard 260. The motherboard 260 can also include daughterboard 250 which can be, for example, a video card, an Ethernet card, a processor card, or any other computer card. The motherboard 260 controls the device module 220 and daughterboard 250. The motherboard 260 can be powered through the rack to which the passive cooling system 100 is mounted. The motherboard 260 includes one or more processors which are thermally coupled to the heat sinks 140 by processor heat pipe assembly 230. Alternatively, other devices of the motherboard 260 and daughterboard 250, for example, a power supply, can also be thermally coupled to the heat sinks 140. Advantageously, the passive cooling system 100 provides effective cooling to the device module 220 and processors of the motherboard 260 without the use of a fan or liquid cooling system, and without the need for additional power or costly maintenance.

Figure 3:
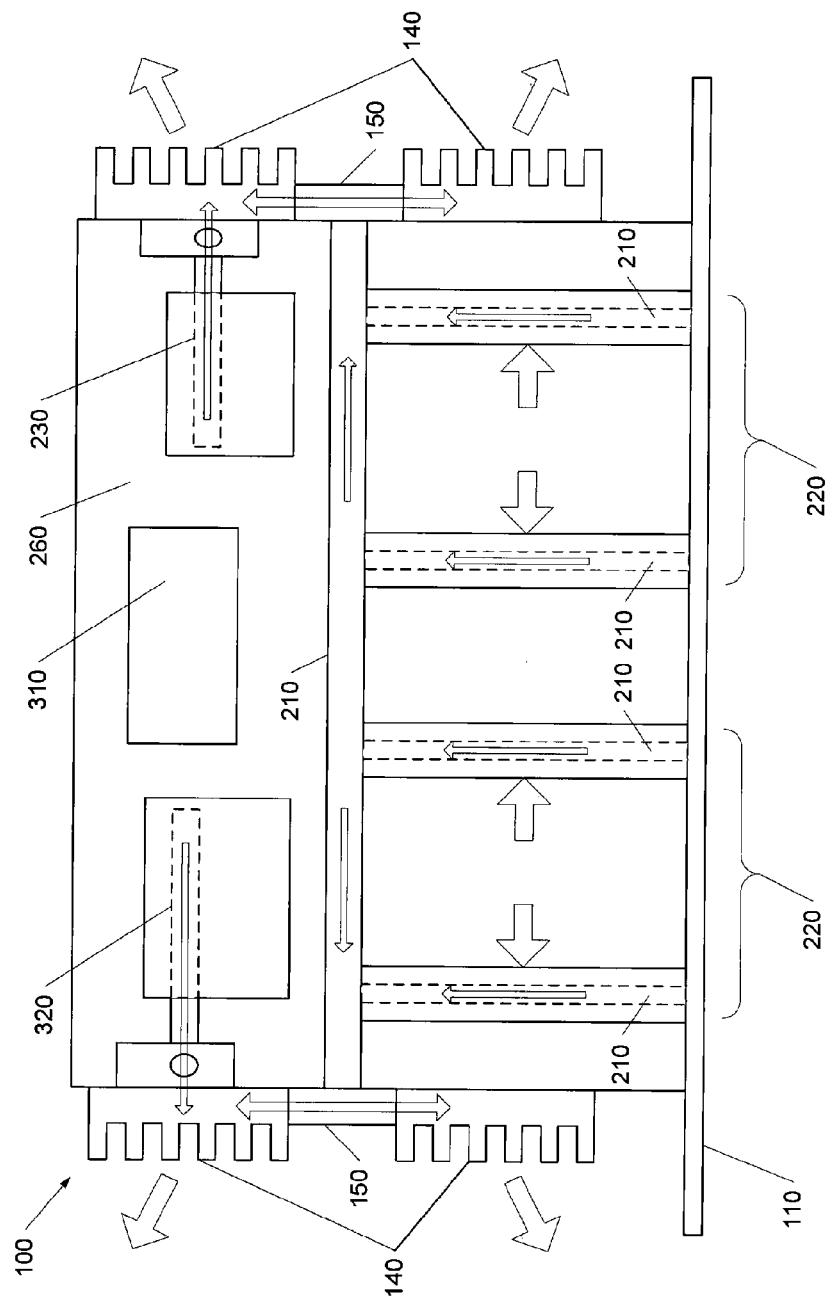
FIG. 3 is a top view of the passive cooling system of FIG. 2 in accordance with a representative embodiment.

Referring to FIG. 3, a top view of the passive cooling system 100 of FIG. 2 in accordance with a representative embodiment is shown. The block arrows depict the main thermal paths through which heat can travel. The passive cooling system 100 includes a front panel 110, heat sinks 140, filler strips 150, a heat pipe assembly 210, device modules 220, a processor heat pipe assembly 230, a motherboard 260, a memory module 310, and a power supply heat pipe assembly 320.

As device modules 220 generate heat, heat pipe assembly 210 draws heat away from the drive modules 220. The filler strips 150 draw heat away from the heat pipe assembly 210. Finally, the heat sinks 140 draw heat away from the filler strips 150 and dissipate the heat into the ambient atmosphere. Thus, the heat sinks 140, filler strips 150, heat pipe assembly 210, and device modules 220 form an open-loop cooling system.

As a processor (not shown) of the motherboard 260 generates heat, processor heat pipe assembly 230 draws heat away from the processor. The heat sinks 140 draw heat away from the processor heat pipe assembly 230. Likewise, as a power supply (not shown) of the motherboard 260 generates heat, power supply heat pipe assembly 320 draws heat away from the processor. The heat sinks 140 draw heat away from the power supply heat pipe assembly 320. In some cases, components do not need additional cooling. For example, memory module 310 can be cooled by the ambient atmosphere. Advantageously, the passive cooling system 100 provides effective cooling to the device module 220, processor and power supply without the use of a fan or liquid cooling system.

Figure 4:
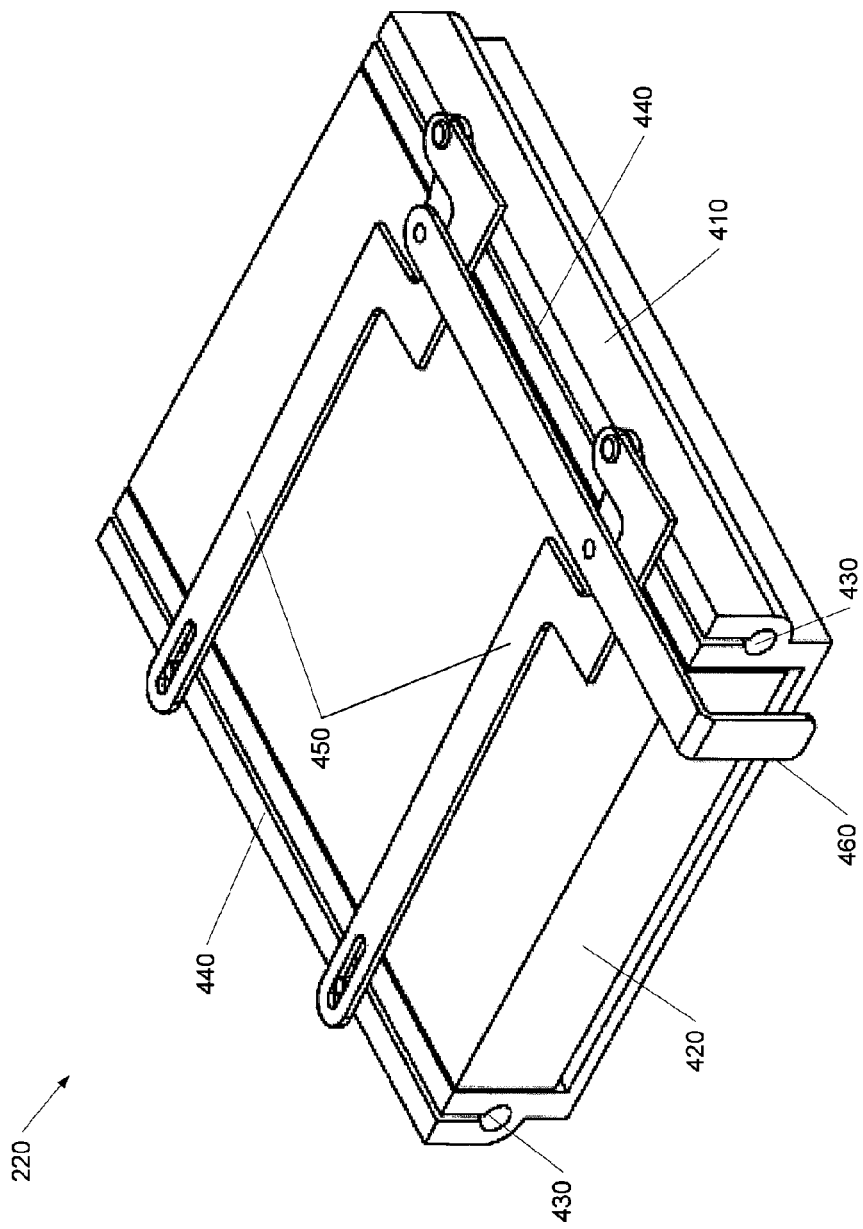
FIG. 4 is a perspective view of the device module of FIG. 2 in accordance with a representative embodiment.

Referring to FIG. 4, a perspective view of the device module 220 of FIG. 2 in accordance with a representative embodiment is shown. The device module 220 includes a cradle assembly 410 and an electronic component 420. The electronic component 420 is fastened to the cradle assembly 410. The electronic component 420 can be a non-volatile storage device, such as a hard disc drive, as described above. The cradle assembly 410 can be both a thermal sink and a docking mechanism for the electronic component 420. The cradle assembly 410 can be made of metal, or any thermally conductive material. Preferably, the cradle assembly 410 is made of aluminum or copper alloy. The cradle assembly 410 can be machined, cast, or extruded. Heat spreaders can be embedded in the cradle assembly 410. A thermal compound can be applied to the space between the electronic component 420 and the cradle assembly 410.

The cradle assembly 410 includes heat pipe conduits 430. The cradle assembly 410 is docked on heat pipes that match heat pipe conduits 430. The cradle assembly 410 can have one or a plurality of heat pipe conduits 430. The heat pipe conduits 430 are disposed on either side of the electronic component 420. Alternatively, the heat pipe conduits 430 can be located near a primary heat source of the electronic component 420. The heat pipe conduits 430 can be 1.5 inches or smaller in diameter depending on the application; however, larger conduits are also possible. For example, the heat pipe conduits 430 can range from 1.5 inches to 0.25 inches in diameter.

Additionally, the heat pipe conduits 430 can each be a different size. For example, a heat conduit/heat pipe located towards the center of an enclosure can be larger than a heat conduit/heat pipe located towards the outside of the enclosure. The heat pipe conduits 430 include clamping slots 440 which can be used to change the size of the heat pipe conduits 430.

The clamping slots 440 are associated with a clamping mechanism 450. When a clamping lever 460 is pressed in, the clamping mechanism 450 closes the clamping slots 440 thereby tightening the heat pipe conduits 430. The clamping action creates a better thermal coupling between the cradle assembly 410 and its associated heat pipes. Additionally, the clamping action fastens the cradle assembly 410 to the heat pipes so that the cradle assembly 410 cannot move and maintain thermal continuity. Thus, the cradle assembly 410 can be quickly removed and replaced. Alternatively, many other clamping and/or attachment mechanisms are possible.

Figure 5A:
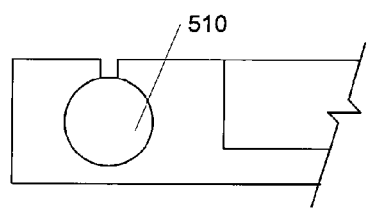
FIG. 5A-5F are diagrams of representative heat pipe topologies in accordance with a representative embodiment.
Figure 5B:
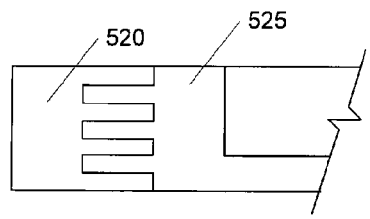
Figure 5C:
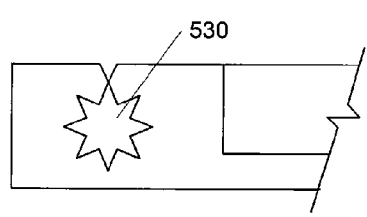
Figure 5D:
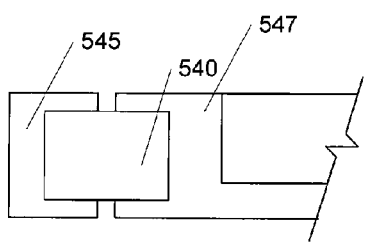
Figure 5E:
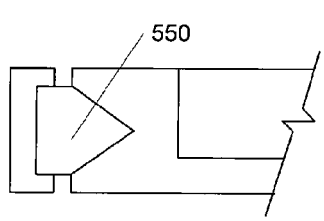
Figure 5F:
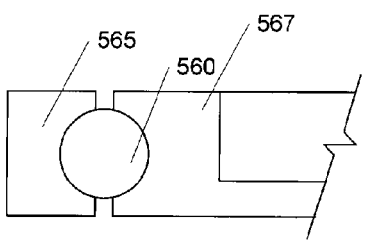

Referring to FIG. 5A-5F, diagrams of representative heat pipe topologies in accordance with a representative embodiment are shown. As shown in FIG. 5A, a heat pipe 510 can be circular. As shown in FIG. 5B, a heat pipe 520 can have fingers that press into the side of cradle assembly 525. As shown in FIG. 5C, a heat pipe 530 can have fins to increase surface area. As shown in FIG. 5D, a heat pipe 540 can be square and be pressed between cradle assembly 547 and a separate batten 545. As shown in FIG. 5E, a heat pipe 550 can be triangular. As shown in FIG. 5F, a heat pipe 560 can be circular and be pressed between cradle assembly 567 and a separate batten 565.

Figure 6:
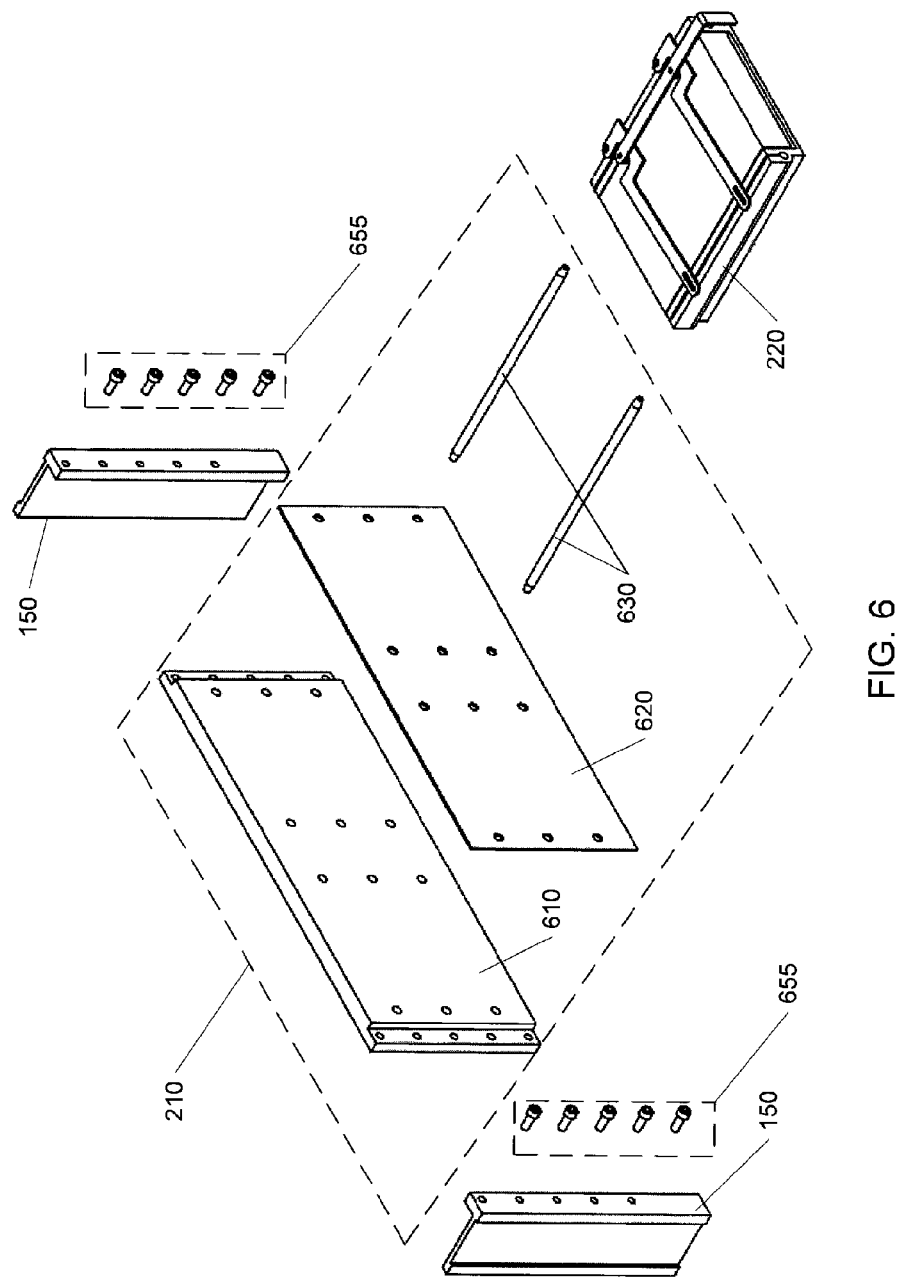
FIG. 6 is an exploded view of the heat pipe assembly of FIG. 2 in accordance with a representative embodiment.

Referring to FIG. 6, an exploded view of the heat pipe assembly 210 of FIG. 2 in accordance with a representative embodiment is shown. The heat pipe assembly 210 includes a bridge plate 610, a back plane printed circuit board (PCB) 620, and heat pipes 630. The heat pipes 630 are coupled to the bridge plate 610 through the back plane PCB 620. The bridge plate 610 is coupled to filler strips 150 by screws 655. A thermal compound can be applied to the space between the bridge plate 610 and the filler strips 150.

The bridge plate 610 can be both a thermal sink and a dock for device module 220. The bridge plate 610 can be made of metal or any thermally conductive material. In some implementations, the bridge plate 610 is made of an aluminum or copper alloy. The bridge plate 610 can be machined, cast, stamped or extruded. Heat spreaders can be embedded in the bridge plate 610. The bridge plate 610 includes a series of tap holes for heat pipes 630. Alternatively, the heat pipes 630 can be fastened to the bridge plate 610 by pressing or other fastening means that provide a good thermal connection. A thermal compound can be applied to the space between the bridge plate 610 and the heat pipes 630.

The device module 220 slides over a pair of heat pipes 630. The heat pipes 630 are tapered at one end to make sliding the device module 220 onto the heat pipes 630 easy. The heat pipes 630 can range from 1.5 inches or less in diameter depending on the application. The heat pipes 630 are arranged so that when a device module is mounted, the heat pipes 630 are disposed on either side of the device module. Alternatively, the heat pipes 630 can be arranged in various configurations around a device module such as on the top and bottom. The heat pipes 630 can be made of metal or any thermally conductive material. Preferably, the heat pipes 630 are made of thermally conductive material, such as copper alloy or aluminum. The heat pipes 630 can also be plated to prevent oxidation. The heat pipes 630 can be machined, cast, stamped or extruded. In use, a thermal compound can be applied to the surface of the heat pipes 630 to promote thermal conductivity to an associated device module 220 and to reduce oxidation. When the clamping mechanism of the device module 220 is set, the cradle assembly of the device module 220 presses against the associated heat pipes 630 creating a thermal and physical connection.

The back plane PCB 620 includes the power and data connections for the device module 220. The back plane PCB 620 is connected to the motherboard of the electronics device. Thus, the device module 220 can be easily electrically connected to the motherboard. The back plane PCB 620 is a custom PCB designed to fit around the heat pipes 630. The back plane PCB 620 includes connections appropriate for the particular kind of electronic component associated with the device module 220. For example, where the device module 220 is mounted with a hard disk, the back plane PCB 620 includes power and serial ATA, EIDE, IDE, or SCSI connectors. Thus, when a user inserts device module into a bay, the device module engages a power connector and a data connector. When the user engages the clamping mechanism, the device module becomes locked in place. The clamping mechanism can be designed to actively engage the connectors on the back plane PCB 620.

Figure 7:
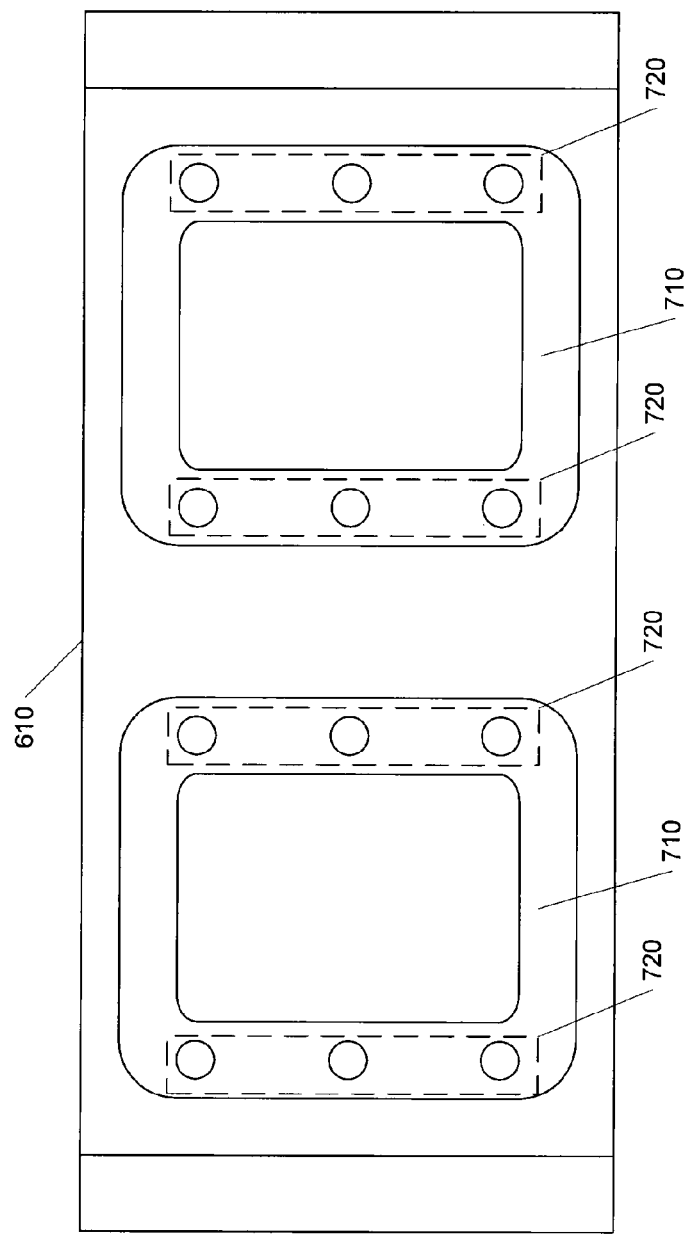
FIG. 7 is a diagram of the bridge plate of FIG. 6 in accordance with a representative embodiment.

Referring to FIG. 7, a diagram of the bridge plate 610 of FIG. 6 in accordance with a representative embodiment is shown. The bridge plate 610 includes heat spreaders 710 for each set of heat pipes. In one implementation, the bridge plate 610 is aluminum and the heat spreader 710 is made of copper alloy. The heat spreader 710 is located inside of the bridge plate 610. The bridge plate 610 also includes holes 720 which are used to attach the heat pipes. The holes 720 go through the heat spreader 710 so that when the heat pipes are attached, there is a direct thermal connection between the heat pipes and the heat spreader 710. The heat spreader 710 increases the thermal transfer efficiency of the bridge plate 610 by directing the thermal flow. In this example, the heat spreaders 710 are doughnut shaped. Alternatively, the heat spreader could run horizontally as well as other configurations.

Figure 8:
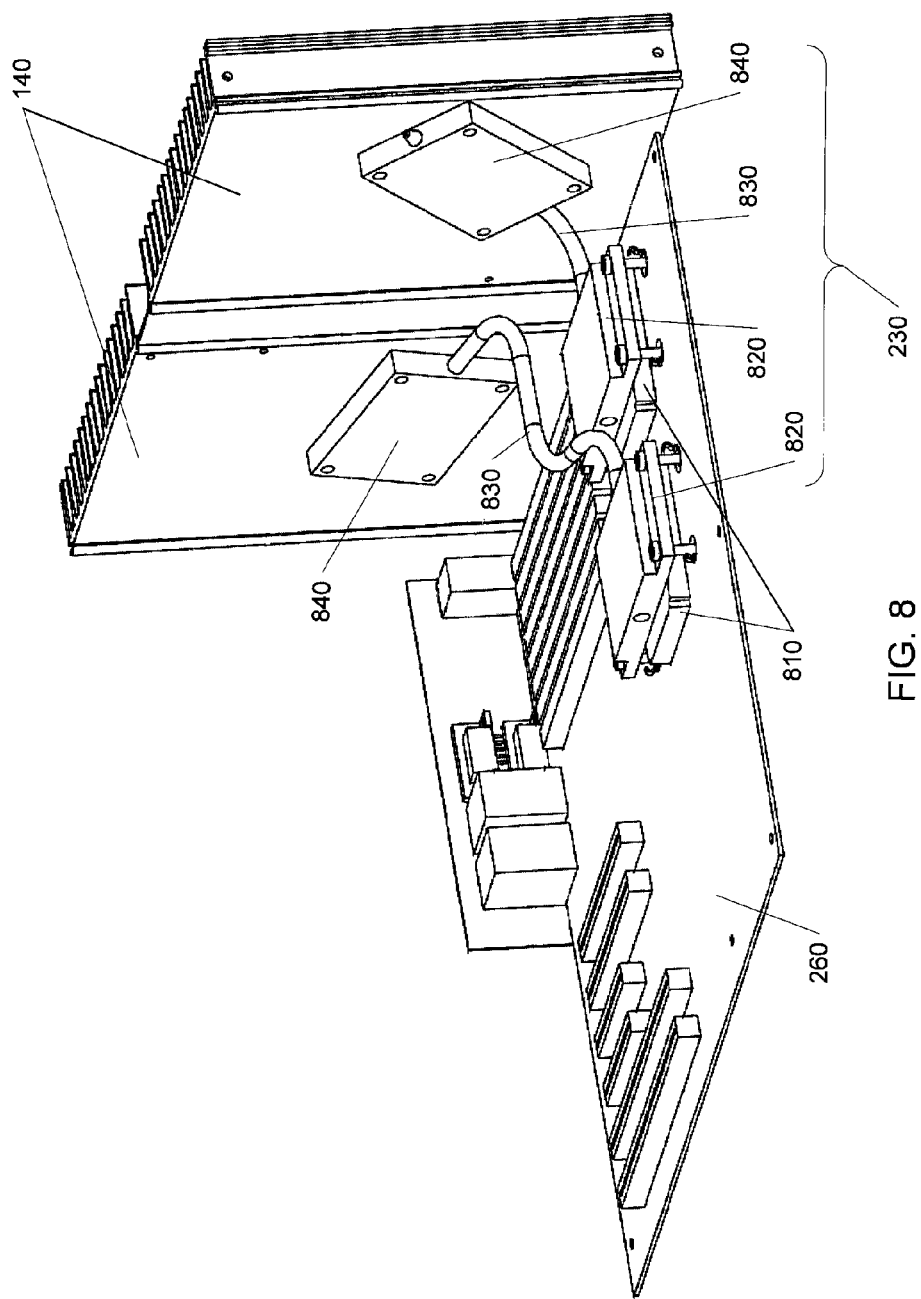
FIG. 8 is a perspective view of the processor heat pipe assembly of FIG. 2 in accordance with a representative embodiment.

Referring to FIG. 8, a perspective view of the processor heat pipe assembly 230 of FIG. 2 in accordance with a representative embodiment is shown. Motherboard 260 includes processors 810. A first thermal mass 820 is attached to each of the processors 810. The first thermal masses 820 are thermally coupled to second thermal masses 840 by heat pipes 830. The second thermal masses 840 are each thermally coupled to a heat sink 140. A thermal compound can be applied between the first thermal masses 820 and the processors; and the second thermal masses 840 and the heat sinks 140.

As the processors produce heat, the first thermal masses 820 draw heat from the processors. The second thermal masses 840 draw heat from the first thermal masses 820 through heat pipes 830. The heat sinks 140 draw heat from the second thermal masses 840. Finally, the heat sinks 140 dissipate the heat into the ambient air. Advantageously, the passive cooling system provides effective cooling to processors without the use of fans or a liquid cooling system.

The foregoing description of the representative embodiments have been presented for purposes of illustration and of description. It is not intended to be exhaustive or to limit the invention to the precise form disclosed, and modifications and variations are possible in light of the above teachings or may be acquired from practice of the invention. For example, the described representative embodiments focused on a representative implementation of a horizontal drive configuration on a rack-mount server. The present invention, however, is not limited to a representative implementation as described and depicted. Those skilled in the art will recognize that the device and methods of the present invention may be practiced using various combinations of components. Additionally, the device and method may be adapted for different electronics systems that need to be cooled. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An apparatus for passively cooling electronics comprising:
    a cradle configured to dock an electronic component such that the cradle is thermally coupled to the electronic component;
    a back plane printed circuit board (PCB) configured to provide an electrical connection for the electronic component;
    a bridge plate thermally coupled to a heat sink; and
    a heat pipe thermally connecting the cradle to the bridge plate through the back plane printed circuit board (PCB).

2. The apparatus of claim 1, wherein the bridge plate comprises an aluminum alloy.

3. The apparatus of claim 2, wherein the bridge plate comprises a heat spreader disposed therein.

4. The apparatus of claim 3, wherein the heat spreader comprises a copper alloy.

5. The apparatus of claim 1, wherein the electronic component comprises a non-volatile storage device.

6. The apparatus of claim 1, wherein the at least one heat pipe has a diameter in a range from 1.5 inches or less.

7. The apparatus of claim 1, wherein the heat pipe comprises a copper alloy.

8. The apparatus of claim 1, further comprising an enclosure configured to be attached to a rack chassis.

9. The apparatus of claim 1, further comprising a first thermal compound between the heat pipe, the bridge plate, and a second thermal compound between the heat sink and the bridge plate.

10. A method for passively cooling electronics comprising:
    drawing heat from an electronic component through a cradle to a heat pipe;
    drawing the heat from the heat pipe to a bridge plate through a back plane printed circuit board (PCB), wherein the back plane printed circuit board (PCB) is configured to provide an electrical connection for the electronic component; and
    drawing the heat from the bridge plate to a heat sink.

11. The apparatus of claim 5, wherein the non-volatile storage device is hot swappable.

12. The apparatus of claim 1, wherein the cradle comprises a conduit configured to receive the heat pipe, wherein the conduit opens at a clamping slot, and wherein the clamping slot is associated with a clamping lever such that when the clamping lever is pressed, the clamping slot is closed and the heat pipe is tightened to the conduit.

13. The apparatus of claim 1, wherein the cradle comprises a conduit configured to receive the heat pipe, and wherein the heat pipe is fastened into the at least one conduit by a separate batten.

14. The apparatus of claim 1, wherein the bridge plate comprises a first conduit and the back plane printed circuit board (PCB) comprises a second conduit, wherein the first and the second conduits are configured to receive the heat pipe, and wherein the heat pipe is fastened into the first and the second conduits.

15. The apparatus of claim 1, wherein the heat pipe comprises fingers extending therefrom, wherein the cradle comprises a conduit configured to receive the heat pipe, and wherein the fingers are configured to interweave with the conduit.

16. The apparatus of claim 1, wherein a cross section of the heat pipe comprises a triangle or is star-shaped.

17. The apparatus of claim 1, wherein the heat pipe is tapered at one end.

18. The apparatus of claim 1, wherein the bridge plate comprises a heat spreader disposed inside the bridge plate, wherein the bridge plate further comprises a conduit configured to receive the heat pipe, and wherein the conduit passes through the heat spreader to create a direct thermal connection between the heat pipe and the heat spreader.

19. The apparatus of claim 1, wherein the electrical connection comprises power and data connections for the electronic component.

20. The apparatus of claim 1, wherein the back plane printed circuit board (PCB) is disposed between the cradle and the bridge plate.

* * * * *